United States Patent [19]
Baba et al.

[11] Patent Number: 5,242,845
[45] Date of Patent: Sep. 7, 1993

[54] METHOD OF PRODUCTION OF VERTICAL MOS TRANSISTOR

[75] Inventors: Yoshiro Baba, Yokohama; Shunichi Hiraki, Chiba; Akihiko Osawa, Machida; Satoshi Yanagiya, Kawasaki, all of Japan

[73] Assignee: Kabushiki Kaisha Toshiba, Kawasaki, Japan

[21] Appl. No.: 866,418

[22] Filed: Apr. 10, 1992

Related U.S. Application Data

[62] Division of Ser. No. 713,505, Jun. 12, 1991, Pat. No. 5,126,807.

[30] Foreign Application Priority Data

Jun. 13, 1990 [JP] Japan .................................. 2-152652

[51] Int. Cl.⁵ .............................................. H01L 21/70
[52] U.S. Cl. ........................................ 437/40; 437/29; 437/203; 437/235; 437/979
[58] Field of Search ..................... 437/29, 40, 41, 203, 437/228, 235, 237, 979; 357/23.4

[56] References Cited

FOREIGN PATENT DOCUMENTS 0065463  5/1980  Japan .................................. 351/23.4
0192174  8/1989  Japan .................................. 351/23.4

*Primary Examiner*—Tom Thomas
*Attorney, Agent, or Firm*—Foley & Lardner

[57] ABSTRACT

A vertical MOS transistor comprises a semiconductor substrate, a first impurity region defined on the surface of the semiconductor substrate, a second impurity region defined under the first impurity region, the conduction type of the second impurity region being opposite to that of the first impurity region, a trench engraved on the surface of the semiconductor substrate to cut through the first and second impurity regions deeper than at least the bottom of the second impurity region, and a gate electrode disposed in the trench with a gate insulation film interposing between the wall of the trench and the gate electrode. The gate insulation film is thicker on the bottom of the trench and on part of the side walls of the trench continuous to the bottom than on the other parts.

10 Claims, 17 Drawing Sheets

METHOD OF PRODUCTION OF VERTICAL MOS TRANSISTOR

This application is a division, of application Ser. No. 07/713,505, filed Jun. 12, 1991 now U.S. Pat. No. 5,126,807.

BACKGROUND OF THE INVENTION

1. Field of the Invention

The present invention relates to vertical MOS transistor and its production method, and particularly to a vertical MOS transistor having low ON-resistance and high withstand voltage at the corners of a gate electrode of the transistor, and a method of producing such a vertical MOS transistor.

2. Description of the Prior Art

The vertical MOS transistor is one of the promising devices that have high driving capacity and a compact substrate.

FIG. 1 shows a conventional vertical MOS transistor disclosed in Japanese Laid-Open Patent No. 1-192174. The transistor comprises an $n^+$-type semiconductor substrate 101, a drain region 103 made of $n^-$-type impurity semiconductor grown epitaxially on the substrate 101, a channel region 105 made of p-type impurity semiconductor disposed in the drain region 103, a source region 107 made of $n^+$-type impurity semiconductor disposed on the channel region 105, a trench 123 formed through the source region 107, channel region 105 and drain region 103, a gate insulation film 109 formed over the surface of the trench 123, a gate electrode 117 disposed in the trench 123 on the gate insulation film 109, an insulation film 121 formed above the gate electrode 117, and a source electrode 119 formed over the insulation film 121. The gate insulation film 109 in the trench 123 forms a thick gate insulation film 129 on the bottom of the trench 123.

The vertical MOS transistor is advantageous in improving cell concentration, i.e., cell integration and reducing ON-resistance. The thick gate insulation film 129 on the bottom of the trench 123 is related to the depth of the trench 123 as well as the ON-resistance and withstand voltage of the transistor. Deepening the trench 123 may decrease the ON-resistance but deteriorate the withstand voltage. Namely, if the trench 123 is deepened to decrease the ON-resistance, it deteriorates the withstand voltage of the vertical MOS transistor. The thick gate insulation film 129 on the bottom of the trench 123 is to improve the deteriorated withstand voltage to a predetermined level (for example, a level that secures a 60-volt system).

FIGS 2A to 2C are views showing a method of producing the conventional vertical MOS transistor of FIG. 1.

In FIG. 2A, the trench 123 is formed through the source region 107, channel region 105 and drain region 103. An oxide film 125 and a nitride film 127 are formed on the surface of the trench 123. The nitride film 127 is removed except on the side faces of the trench 123.

In FIG. 2B, the material is oxidized entirely with heat to thicken the oxide film 125, and the thick gate insulation film 129 is formed on the bottom of the trench 123 according to an LOCOS method.

In FIG. 2C, the trench 123 is filled with polysilicon to form the gate electrode 117. Thereafter, the source electrode 119, etc., are formed.

The vertical MOS transistor formed has the thick gate insulation film 129 on the bottom of the trench 123 to prevent an electric field from collecting at a part of the gate electrode 117, thereby improving the withstand voltage of the transistor.

If the gate insulation film 129 on the bottom of the trench 123 is thin, an electric field collects at the corners of the gate electrode 117 in the trench 123 to deteriorate the withstand voltage, as is apparent from equipotential surfaces shown in FIG. 3.

Although the conventional vertical MOS transistor of FIG. 1 is effective to prevent the electric field from collecting in the corners of the trench, it has a problem. Namely, in thickening the oxide film 129 on the bottom of the trench 123 in the thermal oxidation process of FIG. 2B, each corner 131 of the oxide film in the trench 123 forms a bird's beak shape as shown in FIG. 4. At this time, the nitride film 127 on each side of the trench 123 is pushed up to cause stress in the corners of oxide film 131. As a result, the corners of oxide film 131 dislocate, to easily produce an electrical path at the corner, thereby deteriorating the withstand voltage. Namely, the conventional vertical MOS transistor of FIG. 1 still collects an electric field at each corner of the trench 123.

In addition, the nitride film 127 must entirely be removed from horizontal areas except on the side faces of the trench 123 according to an RIE method. This is very difficult to achieve because the selectivity of the RIE method is poor and because the side faces of the trench 123 are not always precisely vertical, thereby enhancing the risk of etching the nitride film on the side faces of the trench 123 also. This deteriorates the yield and reliability of these transistors. If the vertical MOS transistor has a V-shaped trench with inclined side faces, nitride films on the side faces will completely be etched away. This conventional method, therefore, is not applicable for such a V-shaped trench structure.

An object of the invention is to provide a vertical MOS transistor that realizes a sufficiently high withstand voltage and low ON-resistance, and a method of producing such a vertical MOS transistor.

Another object of the invention is to provide a vertical MOS transistor that can prevent an electric field from collecting to corners of trench of the transistor, and a method of producing such a vertical MOS transistor.

Still another object of the invention is to provide a method of producing vertical MOS transistors at a high yield of production.

In order to accomplish the objects, a vertical MOS transistor according to a first aspect of the invention comprises a semiconductor substrate, a first impurity region defined on the surface of the semiconductor substrate, a second impurity region defined under the first impurity region, the conduction type of the second impurity region being opposite to that of the first impurity region, a trench engraved on the surface of the semiconductor substrate to cut through the first and second impurity regions deeper than at least the bottom of the second impurity region, and a gate electrode disposed in the trench with a gate insulation film interposing between the wall of the trench and the gate electrode. The gate insulation film is thicker on the bottom of the trench and on part of the side walls of the trench continuous to the bottom than on the other parts.

This arrangement can remarkably improve the withstand voltage, particularly at each corner of the trench, so that an electric field may never collect at the corners even if the depth of the trench is deepened to reduce ON-resistance, thereby solving the problem of punch through, etc. This arrangement is particularly effective for power MOS transistors of low withstand voltage, such as those in 60-volt systems.

According to a second aspect of the invention, there is provided a vertical MOS transistor comprising a semiconductor substrate, a first impurity region defined on the surface of the semiconductor substrate, a second impurity region defined under the first impurity region, the conduction type of the second impurity region being opposite to that of the first impurity region, a trench engraved on the surface of the semiconductor substrate to cut through the first and second impurity regions deeper than at least the bottom of the second impurity region, a first gate electrode disposed on the bottom of the trench with a first gate insulation film interposing between the wall of the trench and the first gate electrode, and a second gate electrode disposed over the first gate electrode with a second gate insulation film interposing between the wall of the trench and the second gate electrode. The first gate insulation film is thicker than the second gate insulation film.

According to a third aspect of the invention, there is provided a vertical MOS transistor comprising a semiconductor substrate, a first impurity region defined on the surface of the semiconductor substrate, a second impurity region defined under the first impurity region, the conduction type of the second impurity region being opposite to that of the first impurity region, a trench engraved on the surface of the semiconductor substrate to cut through the first and second impurity regions deeper than at least the bottom of the second impurity region, a floating gate electrode disposed on the bottom of the trench with a first gate insulation film interposing between the wall of the trench and the floating gate electrode, and a main gate electrode disposed over the floating gate electrode with a capacitance insulation film interposing between the floating gate electrode and the main electrode and with a second gate insulation film interposed between the main electrode and the first and second impurity regions. The first gate insulation film is thicker than the second gate insulation film.

According to a fourth aspect of the invention, there is provided a method of producing a vertical MOS transistor comprising the steps of forming a first impurity region on the surface of a semiconductor substrate and a second impurity region under the first impurity region such that the conduction type of the second impurity region is opposite to that of the first impurity region, engraving a trench on the surface of the semiconductor substrate to cut through the first and second impurity regions deeper than at least the bottom of the second impurity region, and disposing a gate electrode in the trench with a gate insulation film interposing between the wall of the trench and the gate electrode such that the gate insulation film is thicker on the bottom of the trench and on part of the side walls of the trench continuous to the bottom than on the other parts.

According to a fifth aspect of the invention, there is provided a method of producing a vertical MOS transistor comprising the steps of forming a first impurity region on the surface of a semiconductor substrate and a second impurity region, under the first impurity region such that the conduction type of the second impurity region is opposite that of the first impurity region, engraving a trench on the surface of the semiconductor substrate to cut through the first and second impurity regions deeper than at least the bottom of the second impurity region, forming a relatively thick first insulation film in the trench, disposing conductive material in the trench on the first insulation film, removing a part of the conductive material above a predetermined first position as well as a part of the first insulation film above a predetermined second position, to form a relatively thick first gate insulation film and a first gate electrode, forming a second insulation film over the first gate electrode and over the upper side walls of the trench such that the second insulation film is thinner than the first gate insulation film, and disposing conductive material on the second gate insulation film to form a relatively thin second gate insulation film and a second gate electrode.

These and other objects, features and advantages of the invention will be more apparent from the following detailed description of preferred embodiments in conjunction with the accompanying drawings.

DETAILED DESCRIPTION OF THE EMBODIMENTS

Figure 1:
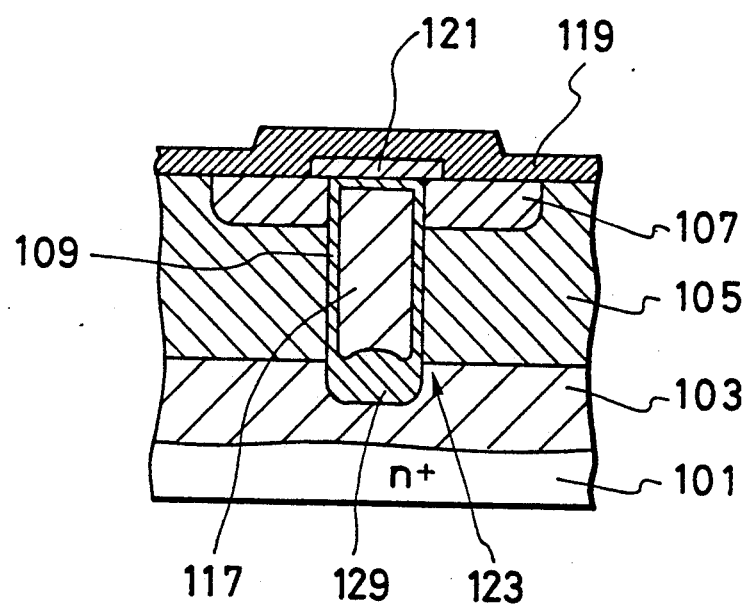
FIG. 1 is a sectional view showing a vertical MOS transistor according to the prior art.
Figure 2A:
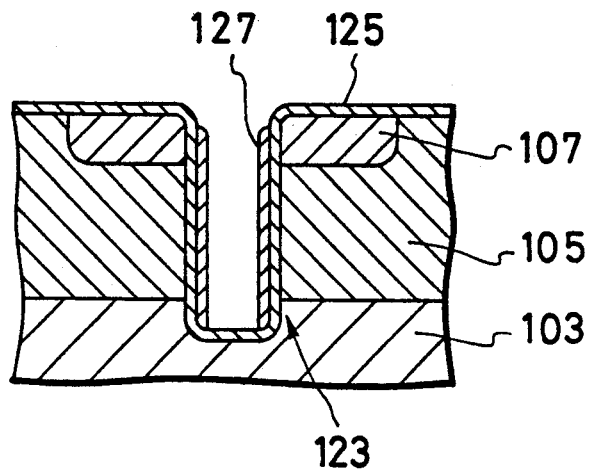
FIGS. 2A to 2C are views showing production processes of the vertical MOS transistor of FIG. 1.
Figure 2B:
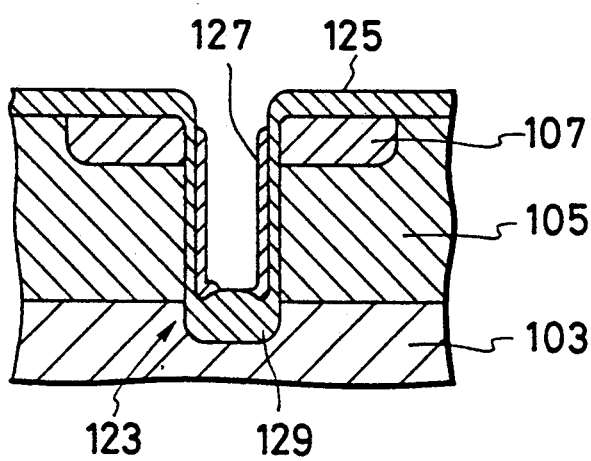
Figure 2C:
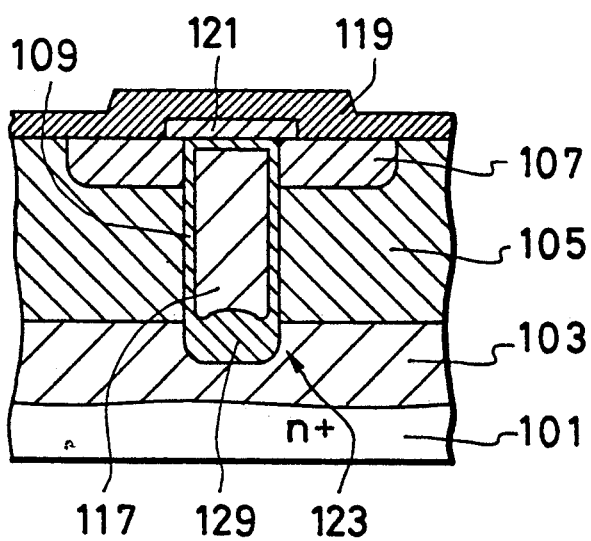
Figure 3:
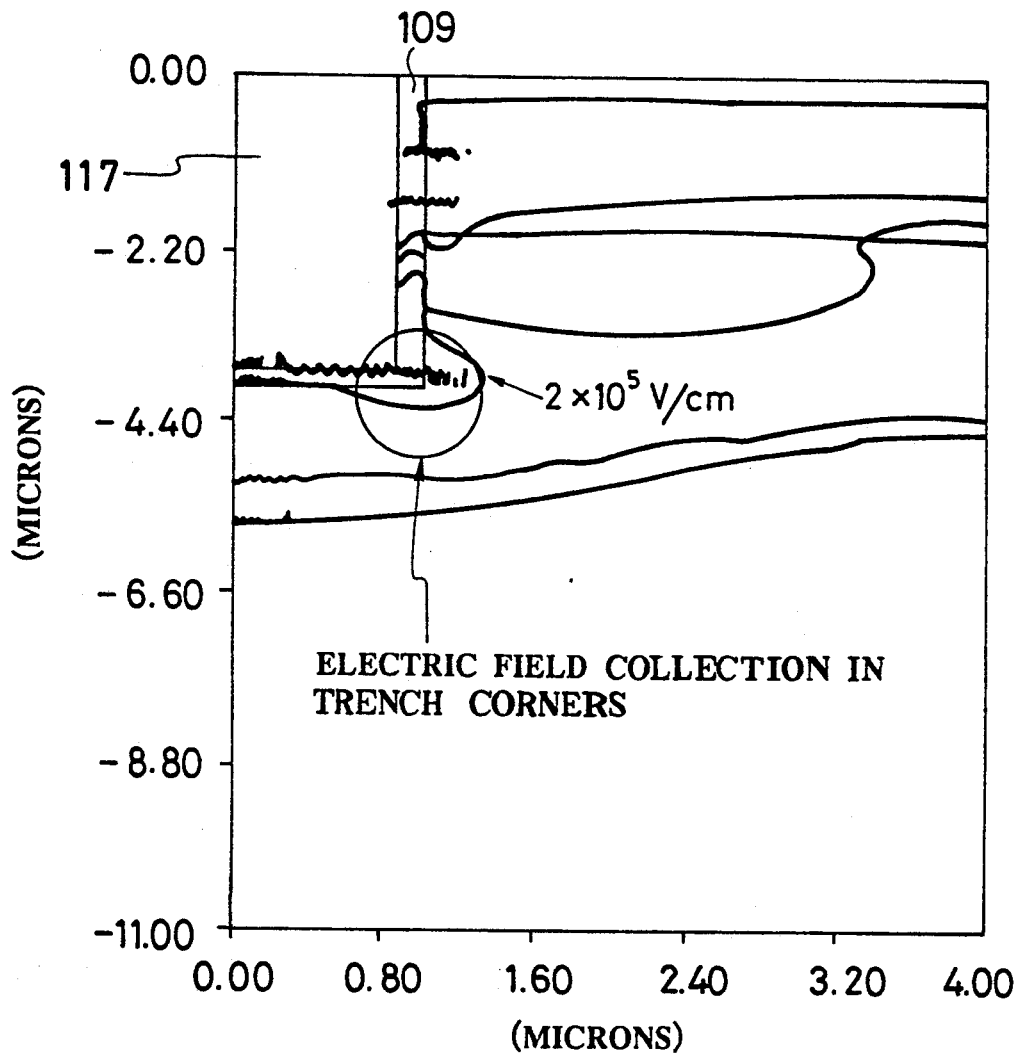
FIG. 3 is view explaining a collection of the electric field at a corner of a trench of the vertical MOS transistor of FIG. 1.
Figure 4:
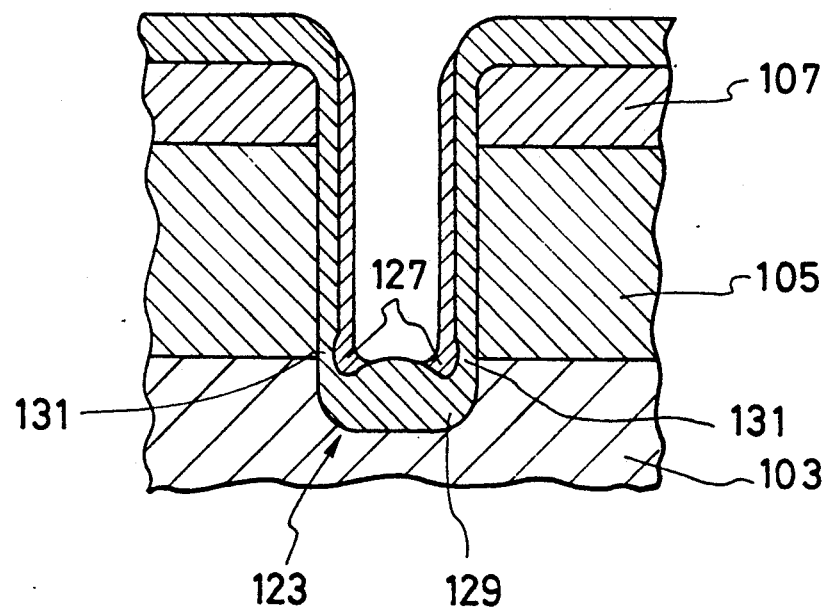
FIG. 4 is a view explaining the problem of the production processes of FIGS. 2A to 2C.
Figure 5:
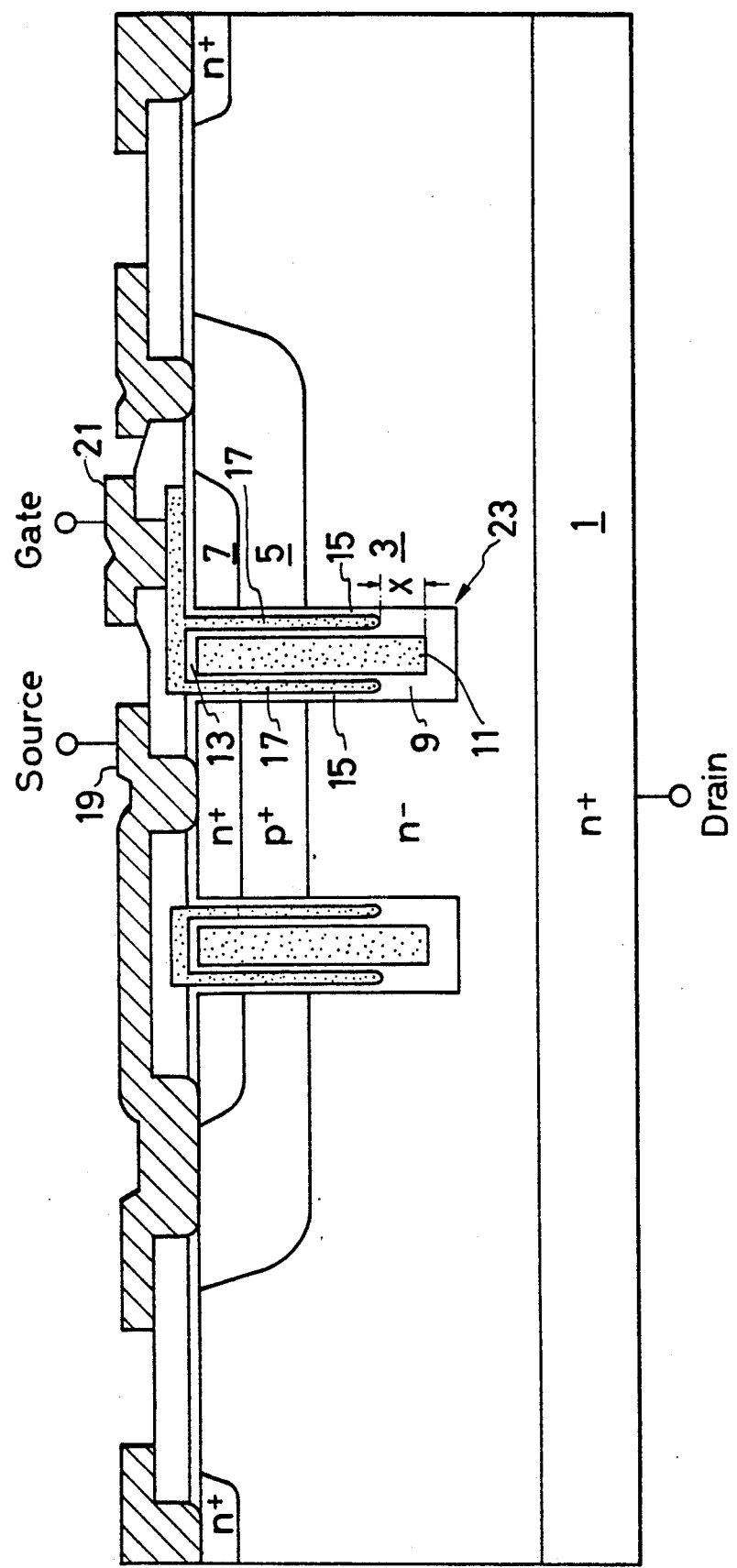
FIG. 5 is a sectional view showing a vertical MOS transistor according to an embodiment of the invention.

FIG. 5 is a sectional view showing a vertical MOS transistor according to an embodiment of the invention. The transistor comprises an $n^+$-type monocrystalline silicon substrate 1, a drain region 3 made of $n^-$-type impurity semiconductor grown epitaxially on the substrate 1, a channel region 5 of 1.5 microns thick made of p-type impurity semiconductor in the drain region 3, a source region 7 of 0.5 microns thick made of $n^+$-type impurity semiconductor on the channel region 5, a trench 23 formed through the regions 5 and 7, a floating gate electrode (a first gate electrode) 11 disposed in the trench 23 to extend above the source region 7 with a relatively thick first gate insulation film 9 interposing between the walls of the trench 23 and the first gate electrode 11, and a main gate electrode (a second gate electrode) 17 formed over the first gate electrode 11 approximately between the upper half of the first gate electrode 11 and the wall of the trench 23 with a capacitance insulation film 13 interposing between the first and second gate electrodes 11 and 17 and with a relatively thin second gate insulation film 15 interposing between the second gate electrode 17 and the channel region 5 and source region 7.

The thickness of the first gate insulation film 9 is in a range of 0.5 to 1.5 microns, for example, 0.8 microns. The thickness of the second gate insulation film 15 is in a range of 300 to 1000 angstroms, for example, 500 angstroms which is very small compared with the thickness of the first gate insulation film 9. Generally, the first gate insulation film 9 is preferable to be 10 times or 2000 angstroms thicker than the second gate insulation film 15.

The top of the first gate insulation film 9 is at the level of the drain region 3 and distanced upwardly by a distance X away from the bottom of the first gate electrode 11. In this embodiment, the distance X is 3 microns.

The source region 7 is connected to a source electrode 19, and the second gate electrode 17 is connected to a gate control electrode 21. When a positive control voltage is applied to the gate electrode 17, the source electrode 19 is electrically connected to the substrate 1 through a channel.

Figure 6:
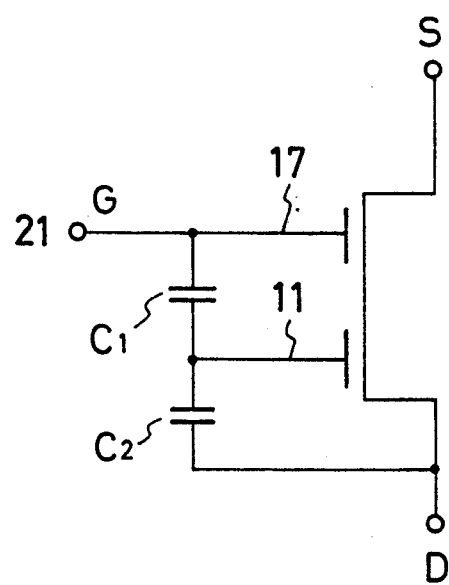
FIG. 6 is a circuit diagram showing an equivalent circuit of the vertical MOS transistor of FIG. 5.

FIG. 6 is a circuit diagram showing an equivalent circuit of the vertical MOS transistor of FIG. 5.

The first gate electrode (floating gate electrode) 11 is connected to the second gate electrode (main gate electrode) 17 and to the substrate 1 through capacitors C1 and C2, respectively. The capacitors C1 and C2 are formed across the first and second gate insulation films 9 and 15, respectively, so that, due to the difference of the thickness of the films, the capacitance of C1 is much smaller than that of C2 (C1<<C2). As a result, potential of the floating gate electrode 11 is very close to that of the main gate electrode 17 to easily form a channel in driving the transistor.

Since the first gate insulation film 9 is thicker on the bottom the trench 23 and on part of the side walls of the trench continuous to the bottom than on the other parts, a withstand voltage at each corner of the trench 23 greatly improves.

Production processes of the vertical MOS transistor of FIG. 5 will be explained with reference to FIGS. 7A through 7I.

Figure 7A:
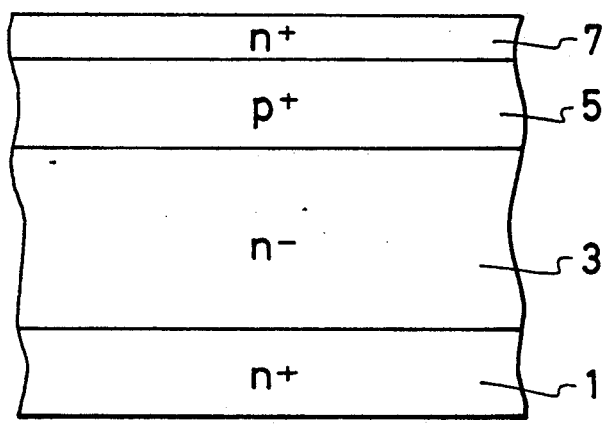
FIGS. 7A to 7I are views showing production processes of the vertical MOS transistor of FIG. 5.

In FIG. 7A, an n⁻-type silicon semiconductor layer 3 is epitaxially grown on the surface of an n⁺-type monocrystalline silicon semiconductor substrate 1. In the layer 3, a p⁺-type semiconductor region 5 of 1.5 microns thick and an n⁺-type semiconductor region 7 of 0.5 microns thick are formed according to a standard diffusion technique.

Figure 7B:
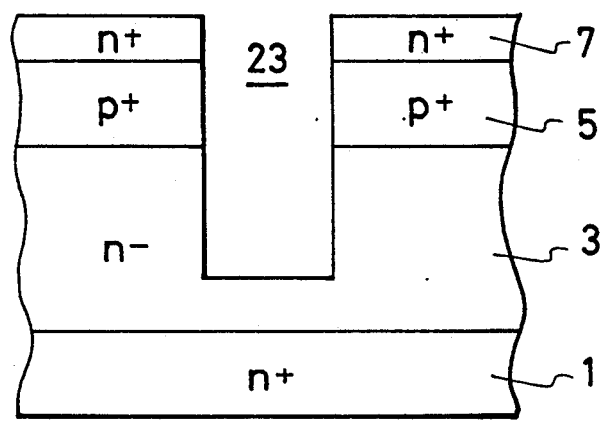

In FIG. 7B, a trench 23 of 2 microns wide and 3.0 microns deep is etched through the two regions 5 and 7 into the semiconductor layer 3 according to an anisotropic etching technique such as an RIE.

Figure 7C:
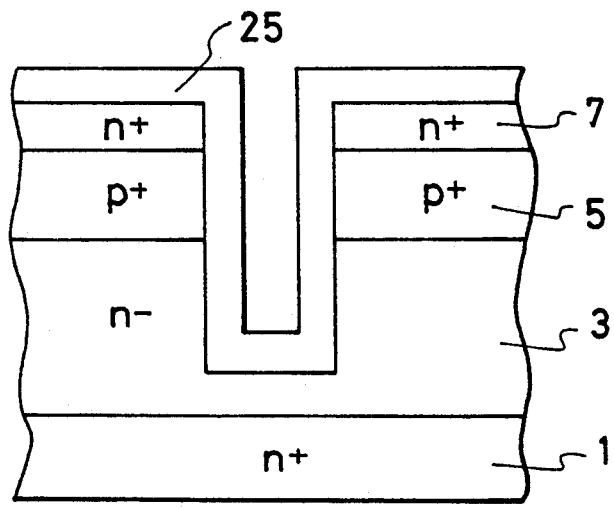

In FIG. 7C, a thick (about 8000 angstroms) silicon oxide film 25 is formed over the material including the inside of the trench 23 according to a thermal oxidation technique.

Figure 7D:
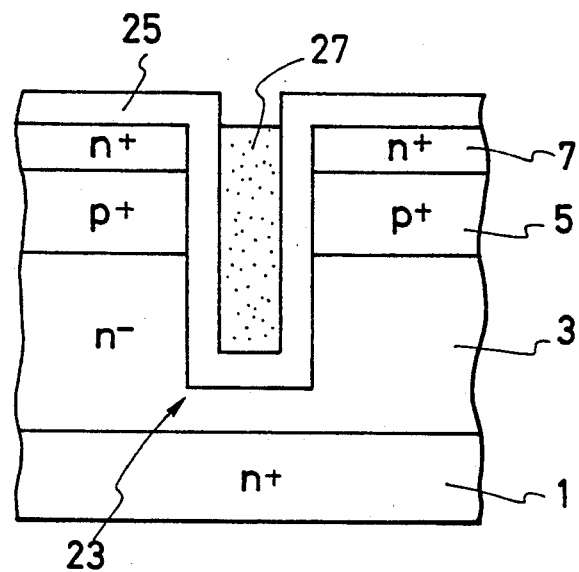

In FIG. 7D, the trench 23 is filled with polysilicon 27 according to an LPCVD technique. The top of the polysilicon 27 is etched back to the level of the source region 7, thereby forming a first gate electrode (a floating gate electrode) 11.

Figure 7E:
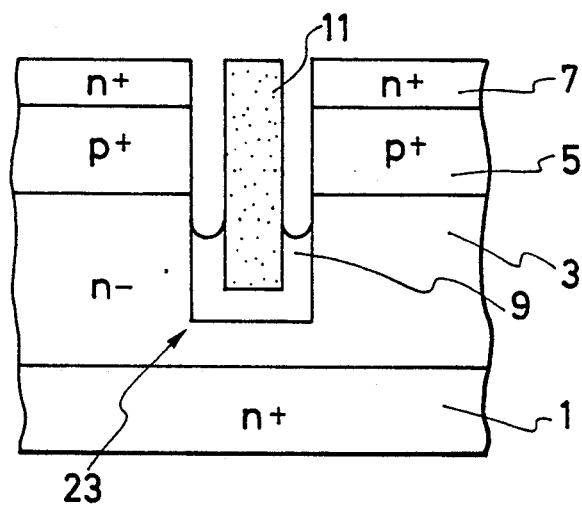

In FIG. 7E, the silicon oxide film 25 is removed according to a wet etching technique using ammonium fluoride except parts lower than a predetermined level of the drain region 3, thereby forming a relatively thick first gate insulation film 9.

Figure 7F:
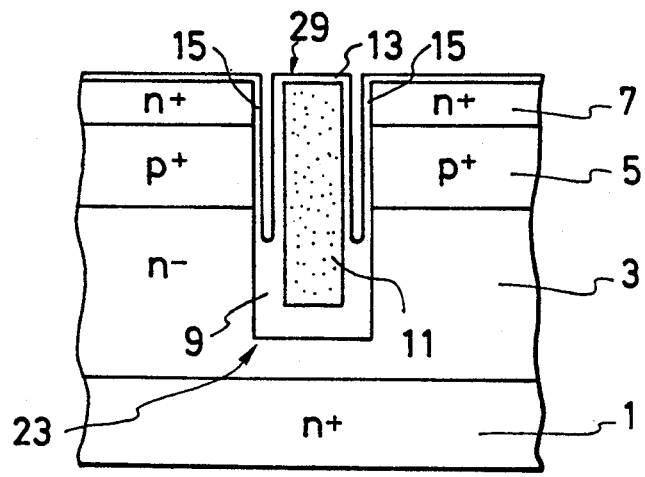

In FIG. 7F, the exposed portion of the first gate electrode 11 and the wall of the trench 23 are thermally oxidized to form a thin silicon oxide film 29 of about 500 angstroms thick, which serves as a capacitance insulation film 13 and a second gate insulation film 15.

Figure 7G:
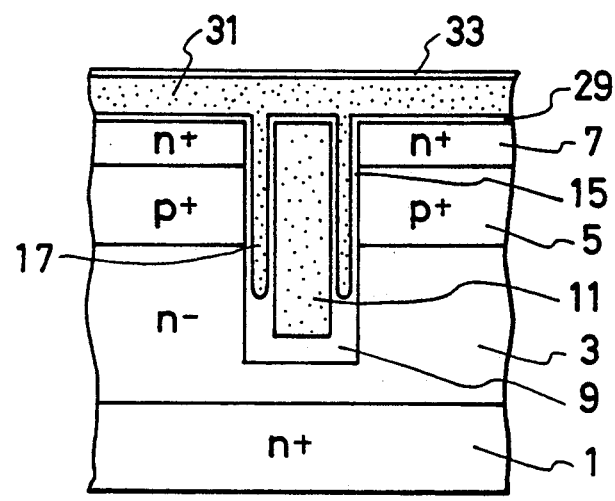

In FIG. 7G, a polysilicon film 31 of 5000 angstroms thick is formed over the material including the inside of the trench 23 according to the LPCVD technique. The surface of the film 31 is thermally oxidized to form a silicon oxide film 33 of 0.1 microns thick.

Figure 7H:
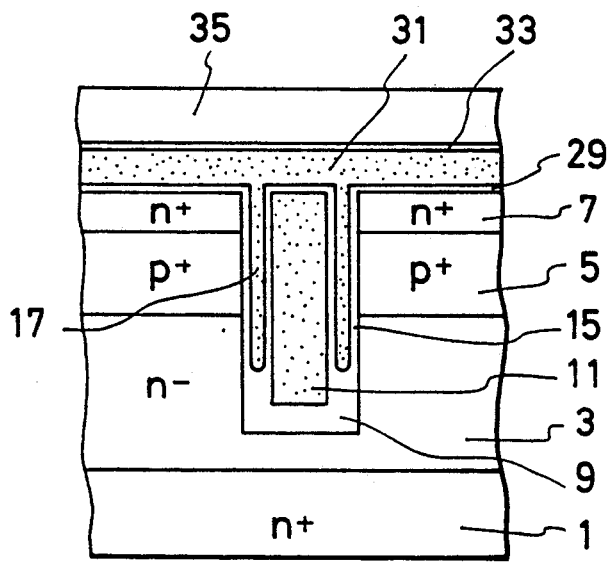

In FIG. 7H, a polysilicon film 35 of one micron thick is formed on the film 33.

Figure 7I:
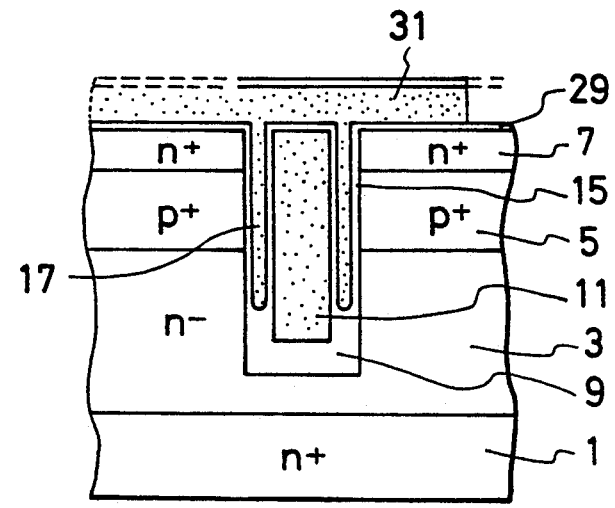

In FIG. 7I, the polysilicon film 35 except in the trench 23 is removed by etching. At this time, the polysilicon film 31 remains as it is because it is protected by the silicon oxide film 33. The silicon oxide film 33 is patterned according to a convetional photolithography method. With the patterned silicon film 33 serving as a mask, the polysilicon film 31 is patterned into a second gate electrode 17.

A gate control electrode 21 and a source electrode 19 are formed according to a conventional method, thereby completing the vertical MOS transistor of FIG. 5.

Although the preferred embodiment has been explained, a person skilled in the art may easily modify the embodiment. For example, the first gate electrode 11 and second gate electrode 17, with the capacitance insulation film 13 between them, may be electrically connected to each other after production. To do so, a contact electrode is provided for the first gate electrode 11, and the contact electrode is connected to the second gate electrode 17 through metal wiring.

Figure 8:
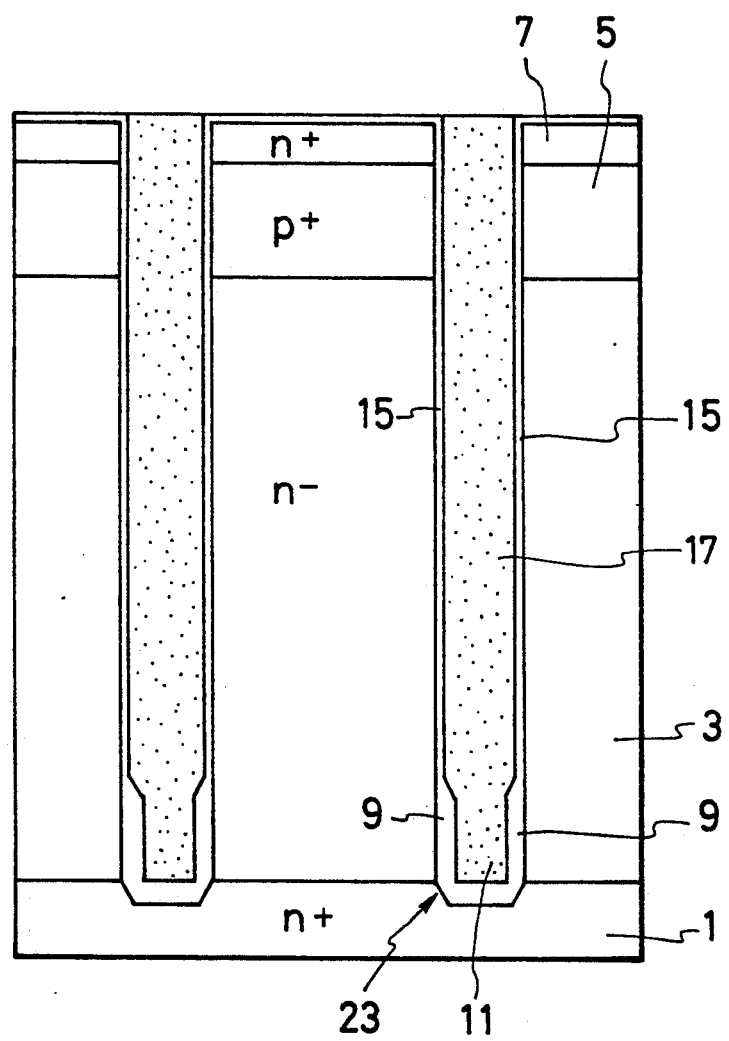
FIGS. 8 and 9 are schematic views showing modifications of the embodiment of FIG. 5.
Figure 9:
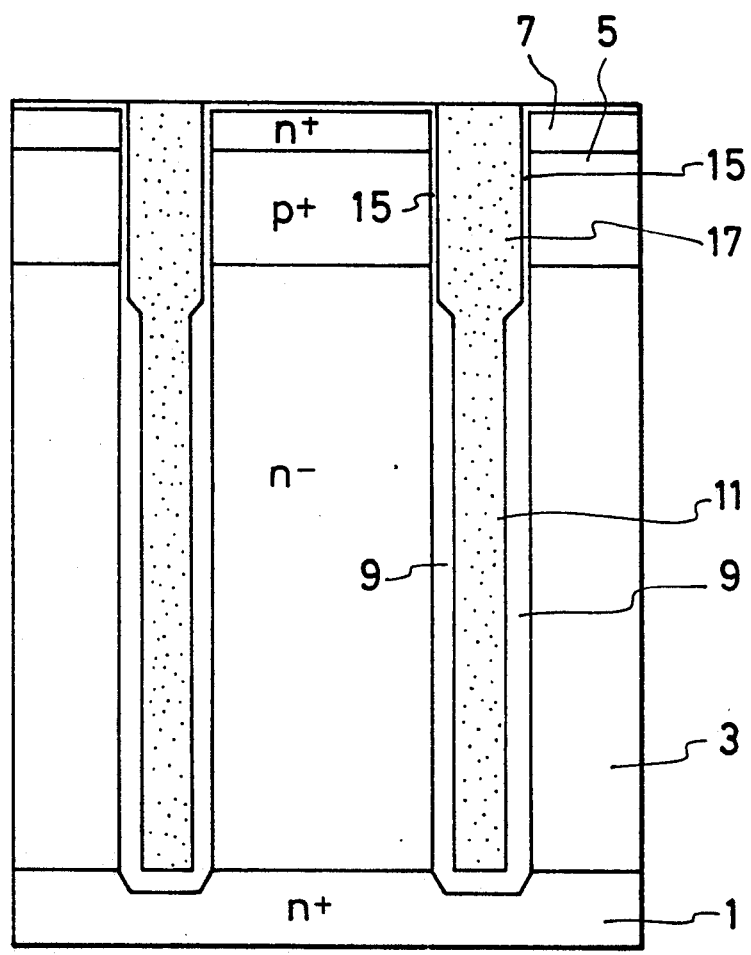

In the processes of FIGS. 7B to 7E, the depth of the trench 23, the position of the top of the polysilicon 27, i.e., the first gate electrode 11 and the position of the top of the first gate insulation film 9 can be changed depending on requirements. For example, the trench 23 may be engraved through the n⁻-type drain region 3 to reach the n⁺-type silicon substrate 1 as shown in FIGS. 8 and 9. According to the modifications shown in FIGS. 8 and 9, the position of the top of the first gate insulation film 9 is one micron or more higher than the top of the substrate 1.

To reduce a product RA (ON-resistance) and improve a withstand voltage, the modifications of FIGS. 8 and 9 partly change the thickness of a gate oxide film of an UMOSFET. Namely, the thickness of the second gate oxide film and the depth of the trench are used as parameters to find a withstand voltage Vds, product RA and capacitance Cgs (gate-drain). The thickness of the second gate oxide film serving as a parameter may be 2000, 3000 or 4000 angstroms when the depth of the trench is 10.5 microns. The depth of the trench serving as a parameter may be 8, 10 or 12 microns when the thickness of the second gate oxide film is one that realizes a withstand voltage Vds of 80 V.

Figure 10:
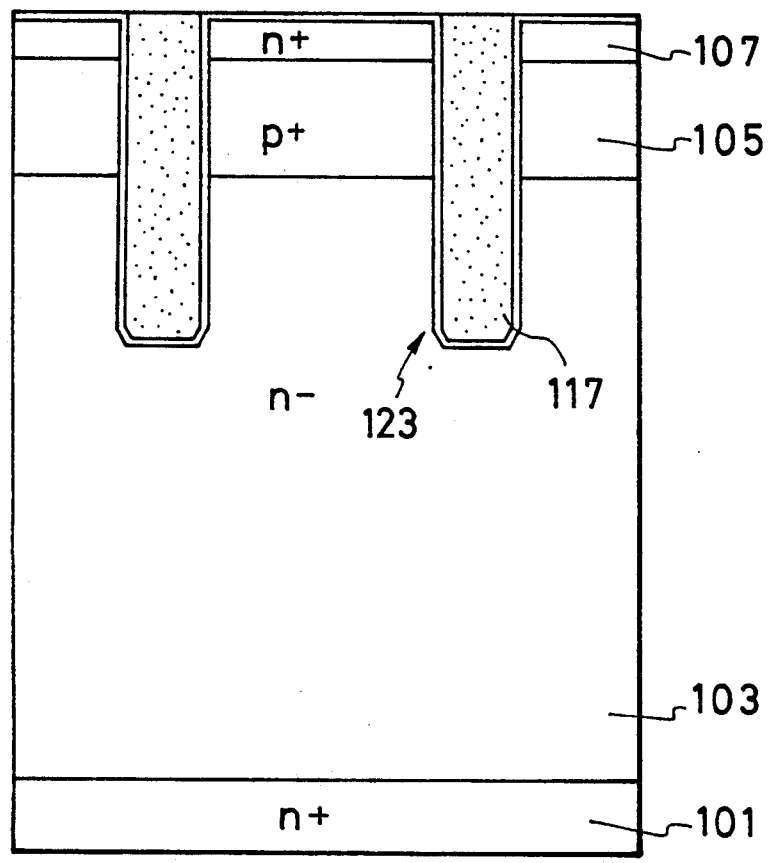
FIG. 10 is a schematic view showing a vertical MOS transistor according to a prior art.
Figure 11:
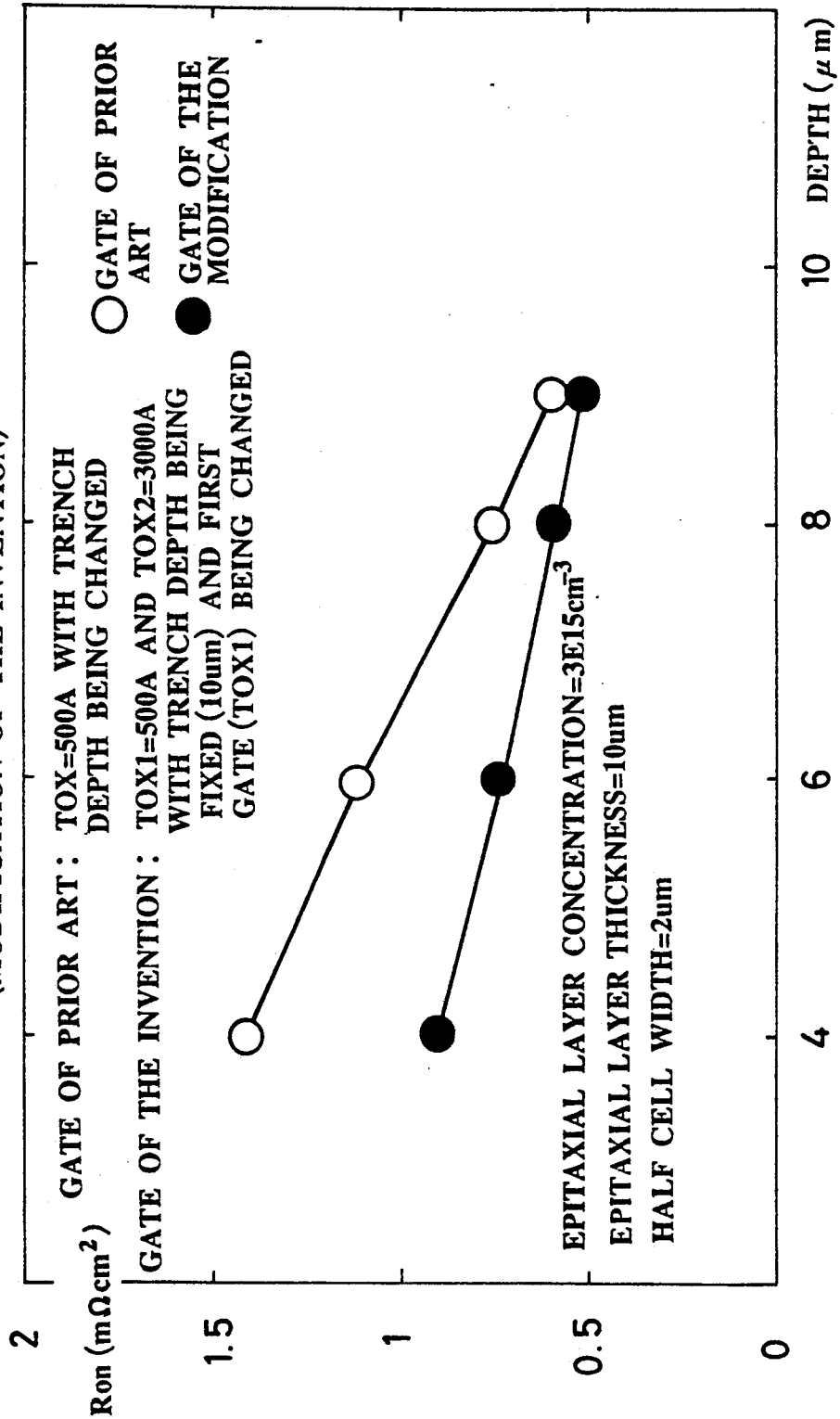
FIGS. 11 to 14 are characteristic curves showing test results conducted on the modifications of FIGS. 8 and 9 and the prior art of FIG. 10.
Figure 12:
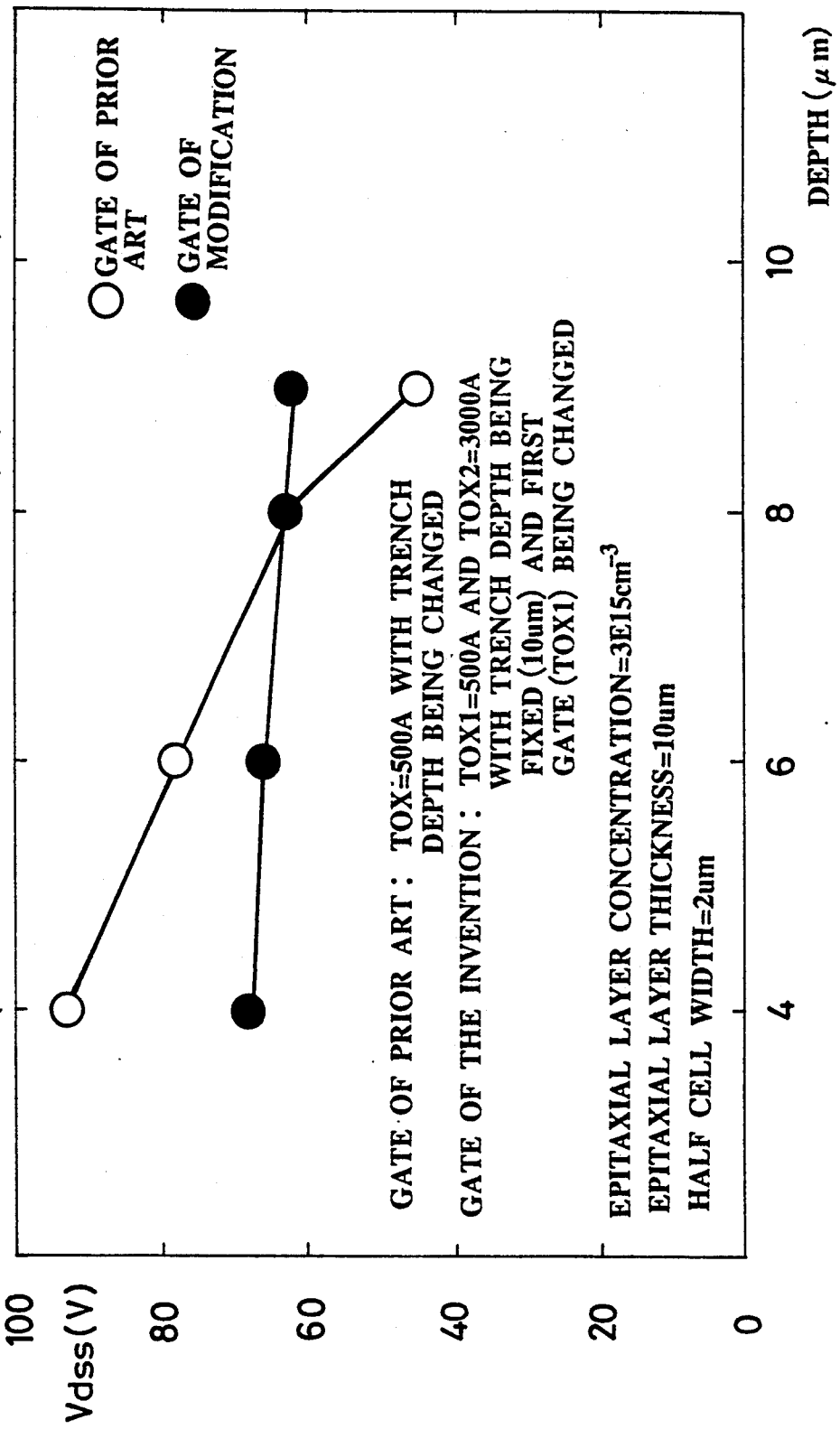
Figure 13:
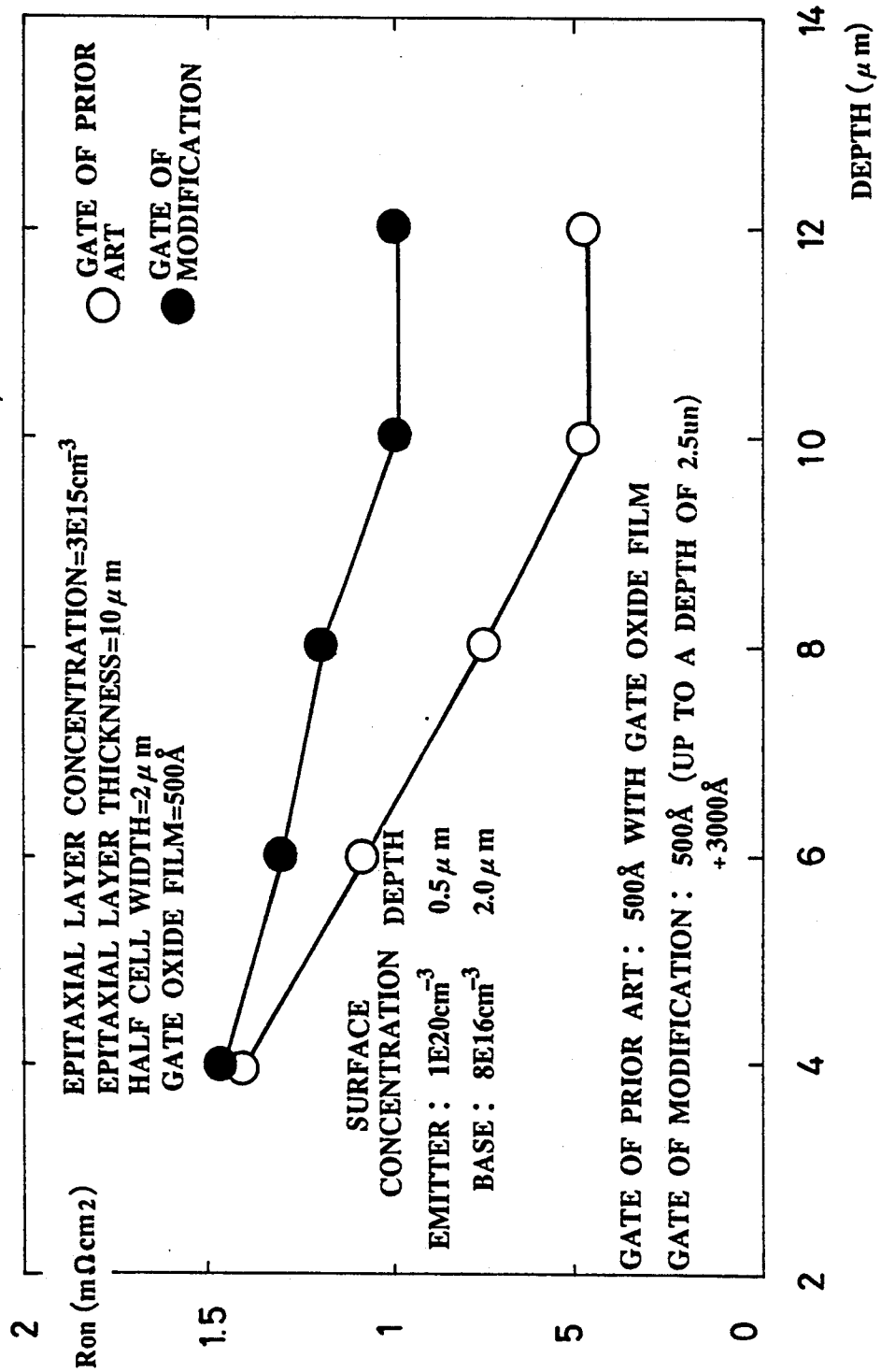
Figure 14:
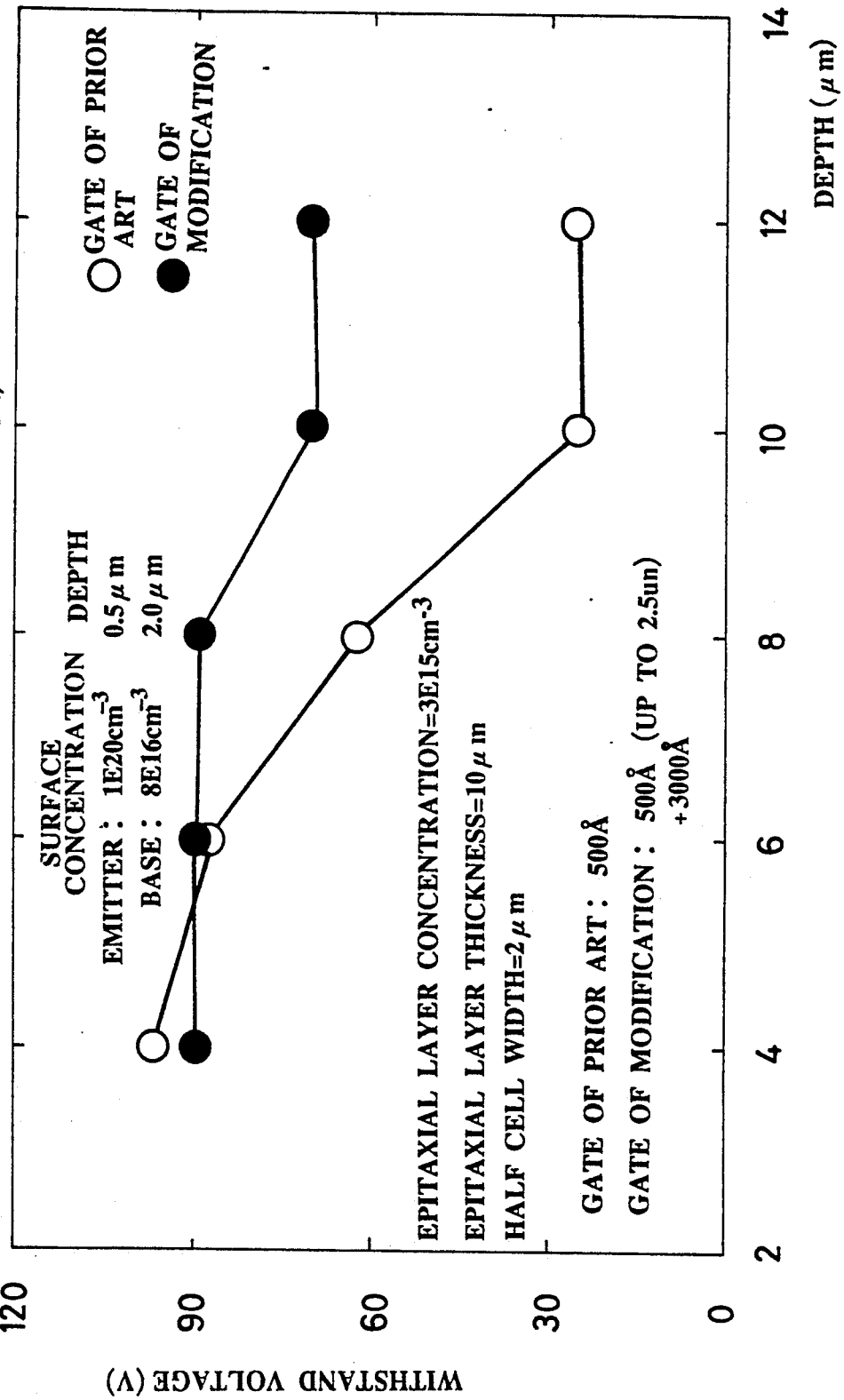

FIGS. 11 to 14 are views showing results of comparison tests carried out according to the above-mentioned conditions to find the ON-resistance and withstand voltages of the modifications shown in FIGS. 8 and 9 and of a UMOSFET according to a prior art shown in FIG. 10.

Figure 15:
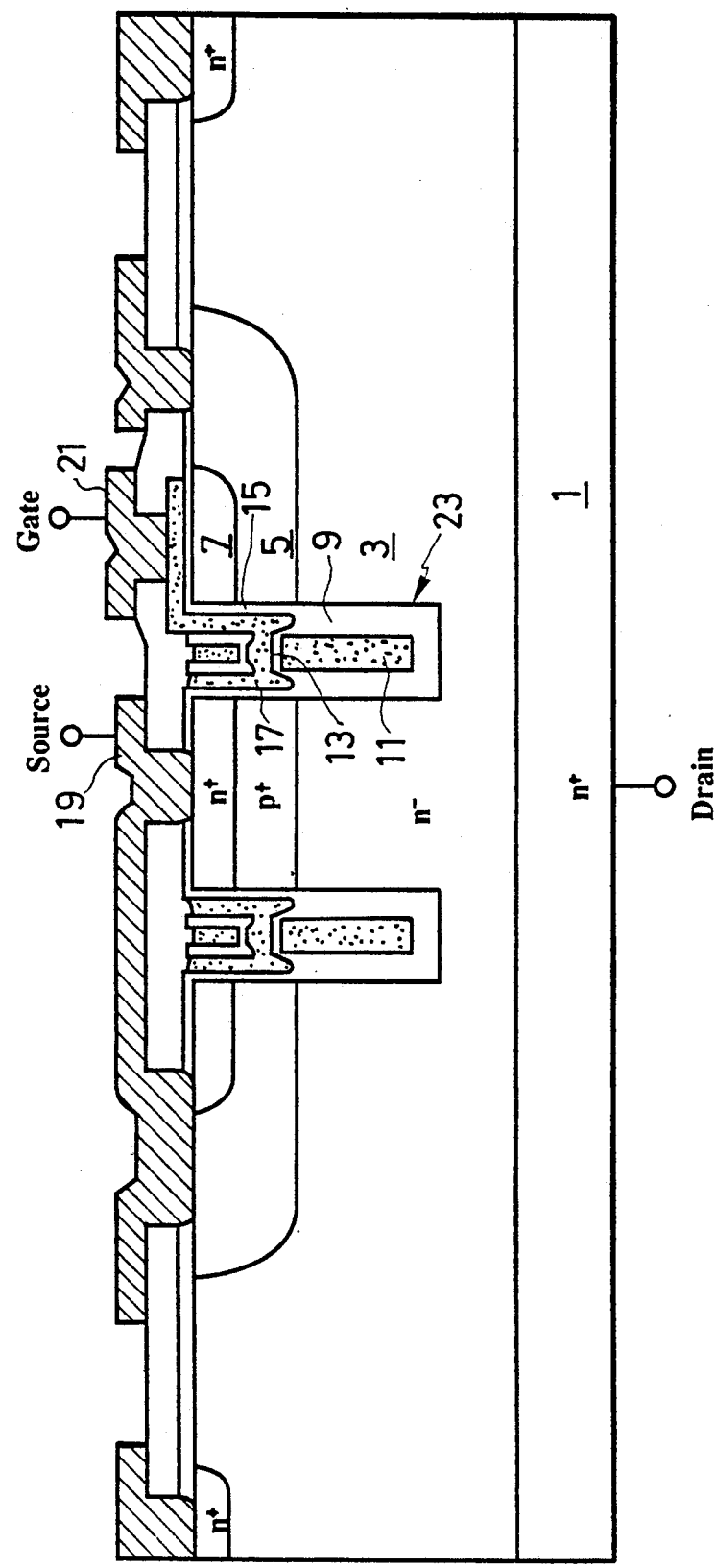
FIG. 15 is another modification of the embodiment of FIG. 5.

FIG. 15 shows another modification of the first embodiment of FIG. 5. Compared with the embodiment of FIG. 5, the embodiment of FIG. 15 has a lower first gate electrode 11 and a higher first gate insulation film 9.

The production processes shown in FIGS. 7A to 7I are applicable for producing transistors having V-shaped trenches.

In summary, a vertical MOS transistor according to the invention has a gate insulation film which is thicker on the bottom of a trench of the transistor and on part of the side walls of the trench contiguous to the bottom than on the other parts. This arrangement remarkably improves a withstand voltage at corners of the trench. Even if the depth of the trench is deepened to reduce ON-resistance, collection of electric fields and punch through will never occur. This invention is particularly useful for power MOS transistors of 60-volt system having a low withstand voltage.

Various modifications will become possible for those skilled in the art after receiving the teachings of the present disclosure without departing from the scope thereof.

What is claimed is:

1. A method of producing a vertical MOS transistor comprising the steps of:
   (a) forming a first impurity region on the surface of a semiconductor substrate and a second impurity region under the first impurity region such that the conduction type of the second impurity region is opposite to that of the first impurity region;
   (b) engraving a trench on the surface of the semiconductor substrate to cut through the first and second impurity regions deeper than at least the bottom of the second impurity region;
   (c) forming a first insulation film in the trench, disposing conductive material in the trench on the first insulation film, removing a part of the first insulation film to leave a first gate insulation film on the bottom of the trench, the upper end of the first gate insulation film being located lower than the bottom of the second impurity region; and
   (d) forming a second insulation film which is thinner than the first gate insulation film over the first gate electrode in the trench and over the upper side walls of the trench, and disposing conductive material on the second insulation film, thereby forming a second gate insulation film thinner than the first gate insulation film and a second gate electrode.

2. The method of producing a vertical MOS transistor according to claim 1, wherein the first predetermined position of the disposed conductive material corresponds substantially to the top surface of the first impurity region.

3. The method of producing a vertical MOS transistor according to claim 2, wherein the trench is formed to reach the semiconductor substrate.

4. The method of producing a vertical MOS transistor according to claim 2, wherein a capacitance insulation film is formed between the first and second gate electrodes.

5. The method of producing a vertical MOS transistor according to claim 2, wherein the first and second gate electrodes are electrically connected to each other.

6. A method of producing a vertical MOS transistor having a source, a drain and a channel, said method comprising:
   forming a trench in a semiconductor substrate composed of a first semiconductor region of a first conductivity type, a second semiconductor region and a third semiconductor region of said first conductivity type, said first, second and third semiconductor regions being vertically arranged from a surface of said substrate in this order, said trench extending through said first and second semiconductor regions and into said third semiconductor region;
   forming an insulation film on an inside surface of said trench;
   forming a conductor on said insulation film in said trench;
   partially removing said insulation film to form a groove extending through said first and second semiconductor regions and into said third semiconductor region, the lower end of said groove being above the lower end of said conductor;
   forming a conductive film functioning as a gate electrode of said MOS transistor in said groove on the inside surface through a gate insulation film, said first and third semiconductor regions forming the source or the drain of said MOS transistor, said second semiconductor region forming the channel of said MOS transistor which electrically connects or disconnects the source and the drain of said MOS transistor in accordance with the signal applied to the gate electrode.

7. The method of claim 6, wherein said second semiconductor region is of a second conductivity type opposite to said first conductivity type.

8. The method of claim 7, wherein said insulation film is an oxide film.

9. The method of claim 6, wherein said oxide film is formed by thermal oxidation of said inner surface.

10. The method of claim 6, wherein the step of removing said insulation film is carried out in order to expose said first and second semiconductor regions in said trench followed by forming of the gate insulation film on the first and second semiconductor regions in said trench.

* * * * *